United States Patent [19]

Yamamoto

[11] 4,306,789

[45] Dec. 22, 1981

[54] SINGLE-LENS REFLEX CAMERA

[75] Inventor: Hiroshi Yamamoto, Yokohama, Japan

[73] Assignee: Canon Kabushiki Kaisha, Tokyo, Japan

[21] Appl. No.: 73,205

[22] Filed: Sep. 7, 1979

[30] Foreign Application Priority Data

Sep. 14, 1978 [JP] Japan ............................ 53-126406[U]

[51] Int. Cl.³ .......................... G03B 7/00; G03B 13/02
[52] U.S. Cl. .................................... 354/60 R; 354/219
[58] Field of Search .................... 354/23 D, 56, 60 R, 354/155, 219, 224, 225; 361/397, 398, 412, 414; 174/68.5

[56]  References Cited

U.S. PATENT DOCUMENTS

| | | |
|---|---|---|
| 3,846,805 | 11/1974 | Kiyohara et al. ............. 354/60 R X |
| 3,979,763 | 9/1976 | Mills ................................ 361/398 X |
| 4,114,036 | 9/1978 | Tsunekawa et al. .......... 354/60 R X |
| 4,134,654 | 1/1979 | Murakami et al. ............... 354/60 R |

FOREIGN PATENT DOCUMENTS 2723214 12/1977 Fed. Rep. of Germany .... 354/60 R

Primary Examiner—L. T. Hix
Assistant Examiner—William B. Perkey
Attorney, Agent, or Firm—Toren, McGeady & Stanger

[57] ABSTRACT

A flexible printed circuit board for a single-lens camera, formed by using two extension sections to connect the ends of a main section which includes a control circuit to the ends of an auxiliary section having a light receiving circuit. In use, the main, auxiliary, and extension sections form a central opening. The main section is bent in place on the roof of a pentagonal prism, and the auxiliary section is arranged to extend vertically upward to face the exit surface of the pentagonal prism.

5 Claims, 3 Drawing Figures

SINGLE-LENS REFLEX CAMERA

BACKGROUND OF THE INVENTION

1. Field of the Invention

This invention relates to a single-lens reflex camera having a flexible printed circuit board disposed between a pentagonal prism and an upper cover thereof.

2. Description of the Prior Art

As a result of the automation of cameras and the application of electronics to cameras, integrated circuit chips and circuit elements provided on a single piece of flexible printed circuit board are now used in cameras. Generally, in single lens reflex cameras, such a flexible printed circuit is disposed between the pentagonal prism and the upper cover of the camera, as disclosed in U.S. Pat. No. 3,846,805.

Generally, a light sensitive element may be arranged around an ocular and mounted on a flexible printed circuit board by one of two methods. In one method, the light sensitive element is mounted directly on the flexible printed circuit board while, in the other method, the light sensitive element is indirectly mounted on the flexible printed circuit board.

In the system where the light sensitive element is mounted directly on a flexible printed circuit board, the light sensitive element is secured to an extended part or section of the flexible printed circuit board; and the fore end of the extended part of the flexible printed circuit board on which the light sensitive element is mounted is carried by a light measuring holder which disposes the light sensitive element in the vicinity of the ocular. However, during manufacture, there is difficulty in mounting the light sensitive element in such a manner. Specifically, in mounting the light sensitive element directly on the fore end of the extended part of a flexible printed circuit board, when the light sensitive element is inserted into the light measuring holder, the extended part of the circuit is too soft and the light sensitive element on the fore end thereof is not optimally positioned for inserting it into the light measuring holder. This may result in the need to search for the fore end of the extended part of the flexible printed circuit board and take it out from a narrow limited space within the camera before the light sensitive element is inserted into the light measuring holder. Also, even after the light sensitive element is inserted into the holder, it is not easy to set it in place because of the softness of the extended section.

In addition to these problems, light measuring integrated circuit chips or bodies have recently combined the light sensitive element with an amplifier in an integrated circuit. Since the integrated circuit is provided with the amplifier, the number of terminals thereof increases. It has been difficult to contact many terminals from both ends of the circuit body with wires that do not cross each other over the extended part. Moreover, since it is necessary to have many wires arranged over the extended part, the extended part must have a greater width. The wide extended part makes it more difficult to mount the light sensitive element onto the light measuring holder, because the former may block view finder light coming from a pentagonal prism, and this must be prevented.

Attempts have been made to facilitate manufacturing process by minimizing these difficulties. One known method involves mounting the light sensitive element indirectly on the flexible printed circuit board. In this method, the light sensitive element is mounted on an unbendable or inflexible hard board. The hard board is attached to an extended part of a flexible printed circuit board. Then, a light measuring holder which is in a given position close to an ocular is arranged to guide and hold this hard board. This method certainly facilitates the mounting and insertion of the light sensitive element into the light measuring holder. However, the problem of preventing the extended part from blocking light coming from the view finder still remains unsolved by this method. Besides, this method calls for mounting of a hard board on the flexible printed circuit board and thus not only causes increase in the number of parts but also requires additional steps in the manufacture.

An object of this invention is to improve cameras.

Another object of the invention is to avoid the aforementioned disadvantages.

SUMMARY OF THE INVENTION

According to a feature of this invention, a printed circuit board with a circuit arrangement having a light sensitive element to be located close to an ocular is disposed on an auxiliary part or section extending from a main part or section of a flexible printed circuit board; and the left and right ends of the main and auxiliary parts of the board are connected by extension or sections to form a hollow or opening between the main and auxiliary parts.

According to another feature of this invention, a single-lens reflex camera having a flexible printed circuit board with the aforementioned structural arrangement, is characterized in that the auxiliary part is held upwardly relative to the main section when the main section is bent to set the printed circuit board over a pentagonal prism. This facilitates insertion of the light sensitive element into a light measuring holder. The aforementioned opening prevents light coming from a view finder from being blocked by the flexible printed circuit board.

These and other objects of the invention will become apparent from the following description of an embodiment when taken in connection with the accompanying drawings.

DESCRIPTION OF THE PREFERRED EMBODIMENT

Figure 1:
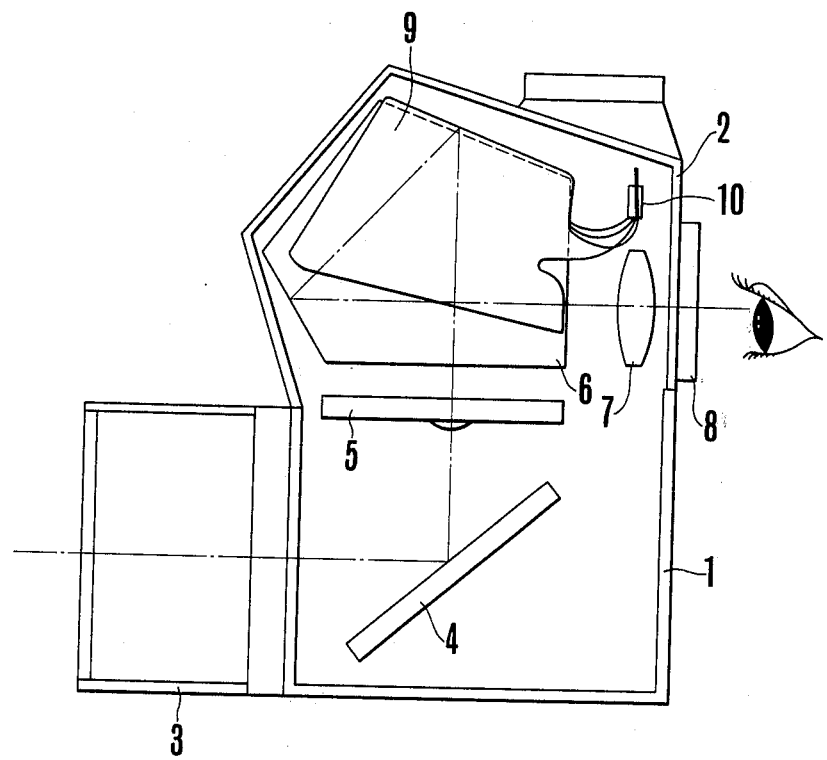
FIG. 1 is a schematic illustration showing the structural arrangement of an embodiment of the present invention.

In FIG. 1 the inside of a camera embodying the invention includes a camera body 1, the upper cover 2, and a photo-taking lens 3. A view finder window 8 permits the photographer to see light coming from the photo-taking lens 3 through a reflex mirror 4, a reticle 5, a pentagonal prism 6 and an ocular 7 which are arranged sequentially within the camera body 1. A flexible printed circuit board 9 is disposed along the roof surface of the pentagonal prism 6 between the pentagonal prism 6 and the upper cover 2 of the camera body 1. An integrated circuit arrangement, body, or chip 10 provided with a light sensitive element 11 and an amplifier is secured by soldering to the flexible printed circuit board 9. The light sensitive element 11 is arranged to receive a portion of a view finder light flux coming from the pentagonal prism 6. A light measuring holder which is arranged to carry the integrated circuit arrangement 10 is omitted from illustration in FIG. 1.

Figure 2:
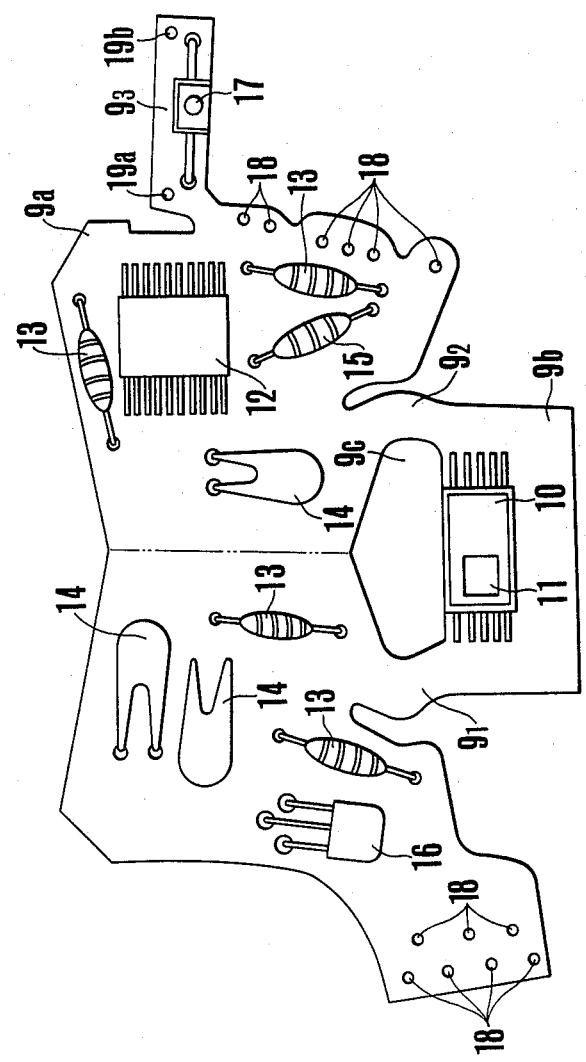
FIG. 2 is a development view showing a flexible printed circuit board indicated in FIG. 1.

In FIG. 2 which is a development view of the flexible printed circuit board shown in FIG. 1, this printed circuit board 9 includes a main printed part of section 9a and an auxiliary printed part or section 9b which are formed almost symmetrically about a dot-dot-dash line shown in the drawing. The auxiliary printed part 9b is rectangular. The two ends of the auxiliary printed part 9b are connected to the main printed part 9a by extension parts $9_1$ and $9_2$ and together the parts form an opening or hollow 9c of an approximately pentagonal shape between the main and auxiliary parts 9a and 9b. The vertex of this pentagonal hollow part 9c is located on the dot-dot-dash line shown in FIG. 2. The aforementioned integrated circuit arrangement, body, or chip 10 is secured by soldering to the auxiliary printed part 9b along with the hollow 9c. The integrated circuit arrangement 10 is provided with the light sensitive element 11 and the amplifier as mentioned in the foregoing. With the amplifier provided in the integrated circuit arrangement body 10, many terminals extend from both ends of the integrated circuit arrangement or chip 10. These terminals are allocated to the right and left sides as desired and are connected by wiring to the main printed part 9a through two extension parts or sections $9_1$ and $9_2$. With the hollow 9c formed between the main printed part 9a and the auxiliary printed part 9b and with the integrated circuit arrangement body 10 secured to the auxiliary printed part 9b in the above stated manner, when the main printed part 9a is folded on the dot-dot-dash line shown in the drawing, a bending force is exerted on the extension parts $9_1$ and $9_2$ to cause the auxiliary printed part 9b to assume an upstanding posture to, i.e. to be oriented or bent upwardly, transverse, relative to the main printed part 9a as shown in FIG. 1.

The main printed part 9a includes an integrated control circuit arrangement body 12, a fixed resistor 13, a capacitor 14, a temperature compensating resistor 15, a trasistor 16, a light emitting diode 17, etc., which are secured by soldering to the main printed part 9a. These circuit elements and the circuit chip 10 are interconnected and are also connected by soldering to outside members such as switches, other circuit boards, etc. at pins and hole-like terminals 18. The light emitting diode 17 is secured by soldering to a protruding part or section $9_3$ extending from the main printed part 9a. In the vicinity of the light emitting diode 17, holes 19a and 19b serve to permit anchoring the section.

Figure 3:
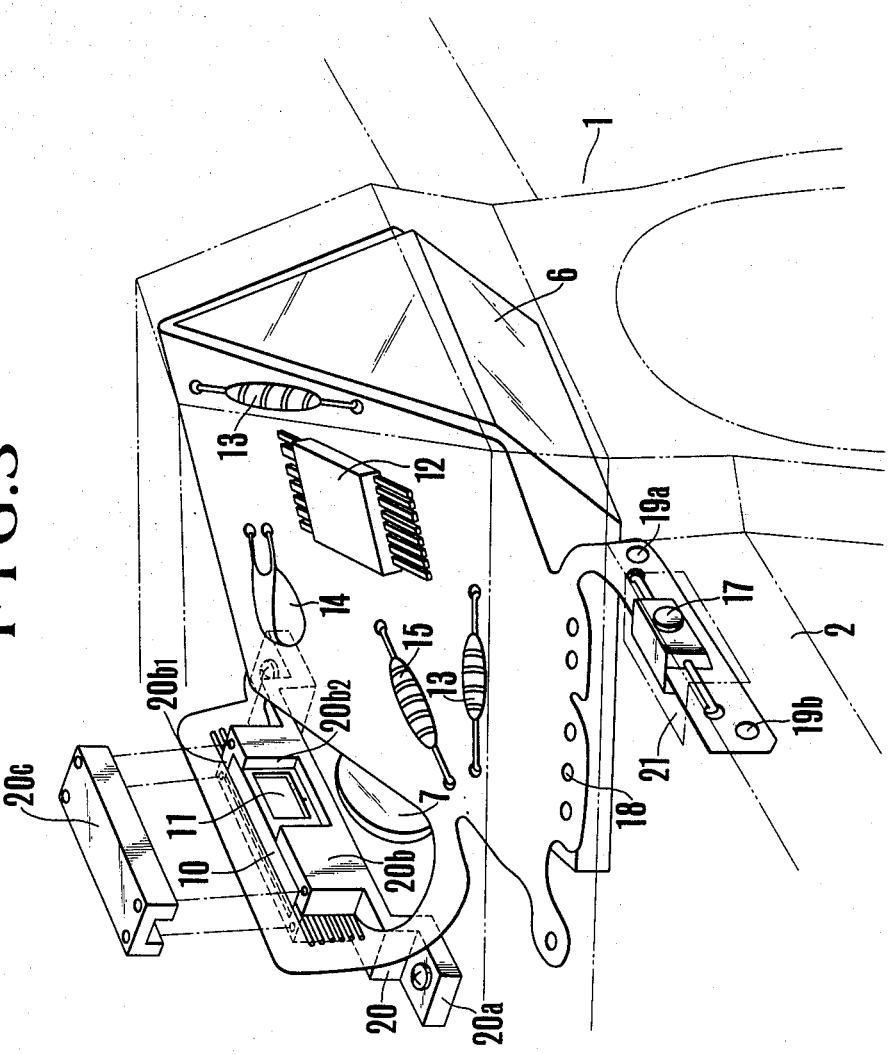
FIG. 3 is a detailed view showing the arrangement of the flexible printed circuit board of FIG. 1.

In FIGS. 2 and 3, the wiring on the circuit board 9 is omitted from the illustration both for simplicity and because the circuit elements and the integrated circuit chips are disposed on one side, i.e. only on one surface of the board, and none of them are disposed on the reverse side. FIG. 3 shows the same flexible printed circuit board 9 of FIG. 2 laid on the pentagonal prism 6 as shown in FIG. 1. Here light measuring holder 20 is disposed above the ocular 7. The light measuring holder 20 is attached to a fixed part within the camera body 1. The light measuring holder 20 is composed of a holder mounting member 20a and a housing 20b which is one step higher than the mounting member 20a. The housing 20b forms a groove 20b1 which is arranged in the longitudinal direction of the housing 20b to permit insertion of the integrated circuit chip 10 of the auxiliary printing portion 9b. Both ends of the groove 20b1 are narrowed to permit just the terminals of the integrated circuit arrangement body to extend therethrough.

The housing 20b is provided also with a cut-away portion 20b2 which is positioned to permit the light sensitive element 11 of the integrated circuit body 10 and the pentagonal prism 6 to confront each other when the integrated circuit body 10 is inserted into the housing 20b. The housing 20b is further provided with a holding plate which is arranged to fix the integrated circuit chip body 10 in place with screws when the circuit chip 10 is inserted into the housing 20b. The light emitting diode 17 is disposed in the vicinity of the pentagonal prism 6 and is arranged to enable a photographer to see a visual display thereof through a diffusing plate 21 which is provided at the upper cover 2. The diffusing plate is disposed at a corner between the upper and front faces of the upper cover 2 in such a manner that the display of the light emitting diode 17 can be seen not only by the photographer but also by a person or persons to be photographed. This arrangement of the light emitting diode 17 is particularly suitable for purposes such as a self-timer display, etc.

In mounting the flexible printed circuit board 9, with the board set in place on the pentagonal prism 6, switches, other printed circuit boards, etc. which are not shown in the drawings are first connected by soldering, with pins, to the hole-like terminals of the flexible printed circuit board 9. Then, the main printed part 9a is bent and folded along the dash-dot-dot line shown in FIG. 2. Since the auxiliary printed section 9b has the integrated circuit body 10 disposed thereon, a bending force produced by the above stated folding action is exerted on the extension parts $9_1$ and $9_2$ to cause the auxiliary printed part 9b to stand up relative to the main printed part 9a. The integrated circuit chip 10 on the auxiliary printed part 9b which has been thus been oriented vertically transverse to the main section 9a is inserted into the groove 20b1 in the housing 20b of the light measuring holder 20 as shown in FIG. 3. The holding plate 20c is then fixed in place by screws to have the integrated circuit chip 10 of the auxiliary printed portion 9b secured to the housing 20b.

With the integrated circuit chip 10 set in place in this manner, the light sensitive element 11 of the chip 10 has a portion of the light from the finder incident thereon through the hollow 9c. Moreover, with the hollow 9c arranged in this manner, the view finder light is guided to the ocular 7 without being blocked. Then the mounting holes 19a and 19b of the protruding section $9_3$ to which the light emitting diode 17 is secured are used to mount the protruding section on a fixed part of the camera body by means of screws or the like. The switches and other printed circuit boards which are not shown in the drawings but are connected by soldering to the flexible printed circuit board 9 are then also attached to fixed parts of the camera body 1. With these steps, the flexible printed circuit board 9 is set in place with the main printed part 9a disposed on the pentagonal prism 6.

As described in detail in the foregoing, in accordance with the present invention, the circuit chip with the light sensitive element to be disposed in the vicinity of the ocular is arranged on the auxiliary printed circuit section which extends from the main printed section of the flexible printed circuit board; and the left and right ends of the main and auxiliary printed parts are connected by extension sections 9₁ and 9₂ to form the hollow 9c between the main and auxiliary printed parts in such a manner that the auxiliary printed section 9b caused to stand up when the main printed part is folded by bending it. With this arrangement, the work of inserting the section 9b into the light measuring holder 20 can be accomplished without difficulty and the light sensitive element 11 also can be easily set in position. Furthermore, since the left and right ends of the auxiliary printed part are connected to the main printed part 9a by the extension parts 9₁ and 9₂ respectively, the many terminals at both ends of the circuit chip 10 can be allocated to the left and right sides as desired for wiring, so that a great number of wires can be arranged without difficulty. Also, with the wires allocatable to the left and right sides, the extension parts can be made with sufficiently narrow widths. In conjunction with this, the provision of the opening 9c ensures that the view finder light coming from the pentagonal prism can be guided to the ocular and the light sensitive element without being blocked.

While embodiments of the invention have been described in detail, it will be evident to those skilled in the art that the invention may be embodied otherwise without departing from its spirit and scope.

What is claimed is:

1. A flexible printed circuit board for a camera having a pentagonal prism with a roof surface and an exit surface, and mounting means positioned at said exit surface, said printed circuit board comprising:
   (a) a main section of flexible printed circuit board to be disposed on the pentagonal prism, said main section having an electric circuit for a camera;
   (b) an auxiliary section of flexible printed circuit board; a light receiving circuit mounted on the auxiliary section;
   (c) a pair of extension sections connecting said auxiliary section to said main section, said sections forming an opening in the printed circuit board to be completely surrounded by said main section, said auxiliary section and the pair of extension sections thereof, said flexible extension sections being arranged for urging the auxiliary section into an upstanding posture facing the exit surface of the pentagonal prism to aid insertion of the light receiving circuit disposed on the auxiliary section into the mounting means.

2. A flexible printed circuit board for a camera having a pentagonal prism having a roof surface, said board comprising:
   (a) a main section of flexible printed circuit board arranged to be disposed on the roof surface of the pentagonal prism, said main section having an electric circuit for the camera;
   (b) an auxiliary section of said flexible printed circuit board, said auxiliary section having a light receiving circuit; and
   (c) a pair of sections of flexible printed circuit board connecting said main and auxiliary sections to each other for forming an opening surrounded by said main, auxiliary, and extension sections; so that the light receiving circuit disposed on the auxiliary section can be positioned against an exit surface of the pentagonal prism by operation of the extension sections.

3. A flexible printed circuit board for a camera according to claims 1, or 2 wherein said light receiving circuit is arranged in the form of an integrated circuit chip having a light sensitive element.

4. A single-lens reflex camera comprising:
   (a) a pentagonal prism inlcuding a roof and an exit surface;
   (b) mounting means facing the exit surface of the pentagonal prism; and
   (c) a flexible printed circuit board having a main section, an auxiliary section, and a pair of extension sections; said main section having an electric circuit for a camera disposed along said roof surface of the prism, and said auxiliary section having a light receiving circuit, said main, auxiliary, and extension sections being arranged to form an opening in the circuit board completely surrounded by said main, auxiliary, and extension sections, the extension selections being flexible and arranged to urge the auxiliary section into an upstanding posture facing the exit surface of the pentagonal prism to aid in insertion of the light receiving circuit disposed on the auxiliary section into the mounting means.

5. A single-lens reflex camera according to claim 4, wherein said light receiving circuit is an integrated circuit and includes a light sensitive element.

* * * * *